United States Patent
Chaudhary et al.

(10) Patent No.: US 6,486,015 B1
(45) Date of Patent: Nov. 26, 2002

(54) LOW TEMPERATURE CARBON RICH OXY-NITRIDE FOR IMPROVED RIE SELECTIVITY

(75) Inventors: Nirmal Chaudhary, Poughkeepsie, NY (US); Richard A. Conti, Mt. Kisco, NY (US)

(73) Assignees: Infineon Technologies AG, Munich (DE); International Business Machines Corporation, Armonk, NY (US)

(*) Notice: Subject to any disclaimer, the term of this patent is extended or adjusted under 35 U.S.C. 154(b) by 0 days.

(21) Appl. No.: 09/557,363

(22) Filed: Apr. 25, 2000

(51) Int. Cl.⁷ .......................................... H01L 21/8238
(52) U.S. Cl. .................. 438/229; 438/233; 438/295; 438/780; 438/786
(58) Field of Search .................. 438/201, 211, 438/229, 233, 295, 780, 786, 710, 724, 514, 638

(56) References Cited

U.S. PATENT DOCUMENTS 5,731,242 A * 3/1998 Parat et al. .................. 438/586
5,828,096 A * 10/1998 Ohno et al. .................. 257/306
5,935,873 A * 8/1999 Spüler et al. ................ 438/710
6,180,472 B1 * 1/2001 Akamatsu et al. .......... 438/303
6,207,514 B1 * 3/2001 Furukawa et al. .......... 438/299
6,218,275 B1 * 4/2001 Huang et al. ................ 438/595
6,235,650 B1 * 5/2001 Yao ............................. 438/786

FOREIGN PATENT DOCUMENTS

EP          0661386 A1 *  5/1995
JP          7-254599      * 10/1995

OTHER PUBLICATIONS

Wolf and Tauber; "Silicon Processing for the VLSI Era vol. 1; Process Technology" 1986 Lattice Press, pp. 188–195 and 541–544.*

* cited by examiner

Primary Examiner—Wael Fahmy
Assistant Examiner—Fernando Toledo
(74) Attorney, Agent, or Firm—Stanton Braden

(57) ABSTRACT

Reactive ion etch (RIE) selectivity during etching of a feature nearby embedded structure is improved by using a silicon oxynitride layer formed with carbonization throughout layer.

6 Claims, 2 Drawing Sheets

LOW TEMPERATURE CARBON RICH OXY-NITRIDE FOR IMPROVED RIE SELECTIVITY

BACKGROUND OF THE INVENTION

1. Field of the Invention

The present invention generally relates to DRAM fabrication and more particularly to self-aligned contact etching.

2. Background Description

A self-aligned contact (SAC) etch is one of the most difficult reactive ion etch (RIE) processes in a DRAM fabrication sequence. It is a three step process utilizing different etch chemistries. Step one is a non-selective or traditional oxide etch of silicon dioxide to the gate cap Nitride. The next step involves the etching of borophosphorous silicate glass (BPSG) with a very high selectivity to Nitride liner and gate cap Nitride, which tests the limit of a RIE tool. Finally, in the third step the bottom liner is removed through to a silicon substrate so that an ohmic contact can be formed subsequently.

One problem with the current SAC and nitride liner process is that it requires high temperatures (720–800° C.). A reduced thermal budget is preferred in future generations of DRAM devices to minimize dopant diffusion.

Better selectivity to nitride (liner) is needed for an improved bit-line shorts yield. However, there is also a need to thin the nitride liner as much as possible, for improved BPSG gap-fill. Hence, from the point of view of gap-fill by BPSG a thinner liner would be better, but for contact etch/RIE a thicker liner is better to relax selectivity requirements.

Currently, the contact nitride liner used for 0.175 $\mu$m technology is Dichloro Silane (DCS) based LPCVD Nitride. Even though the selectivity to this liner during contact etch has greatly been improved due to new gas chemistries and processes that are continually being evaluated and introduced, it is still desirable to improve the core selectivity during RIE to improve shorts yield. Improvement in contact shorts yield is still one of the main issues facing many DRAM producing fabricators. Prior art has disclosed methods to improve this selectivity by exposure to $CF_4$ after Nitride liner deposition. U.S. Pat. No. 5,935,873 to Spuler et al. discloses a method for forming a self-aligned contact in a semiconductor device incorporating carbon in a nitride layer. As disclosed, a portion of the nitride layer is carbonized to reduce the nitride etch rate. Specifically, the Spuler et al. reference discloses carbonizing only a top surface on the nitride. During etching processes, when this surface carbonization is broken through, undercutting during etch occurs rapidly. It was thought that $CF_4$ polymer would enhance the selectivity to Nitride. However, the art does not mention or explain as to how difficult and expensive it may be to deposit a layer of $CF_4$ or 'diamond-like carbon' (DLC), or whether it would even be feasible to deposit such a layer. In short, prior art did not show a practical method to improve selectivity to contact liner. To our knowledge, we are not aware of any developments whereby $CF_4$ has been successfully incorporated into the said Nitride film to improve its selectivity to RIE etch.

SUMMARY OF THE INVENTION

It is therefore an object of the present invention to provide a low temperature carbon rich oxy-nitride liner process which has improved RIE (reactive ion etch) selectivity.

In this invention a practical method of improving the selectivity to contact liner is shown along with preliminary data to back up our claims. The main embodiment of this invention is the use of bis-tertbutylaminosilane (BTBAS or $SiH_2(NH(C_4H_9))_2$) precursor to deposit silicon oxynitride for contact liner application. However, other similar organosilane or organoaminosilane based precursors such as ditertiarybutyl silane may also be used. The object of this invention is the use of novel oxynitride precursors that when used would result in a precalculated amount of carbon content that is uniformly distributed in the final deposited film. BTBAS is used in the preferred embodiment. Further, the object is to use this film as a RIE barrier.

The basis of the invention hinges on two factors: 1) Use of BTBAS precursor to obtain a carbon rich nitride film and 2) deposition of oxy-nitride film as opposed to nitride film. The use of BTBAS precursor also allows the lowering of the deposition temperature from 720–800° C. for process of record conditions to about 600° C. Lowering of processing temperature minimizes diffusion of dopants. Such diffusion would undesirably change or perturb dopant profiles. The increased carbon concentration in such a film also provides better selectivity during SAC process and improved process window as explained below.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
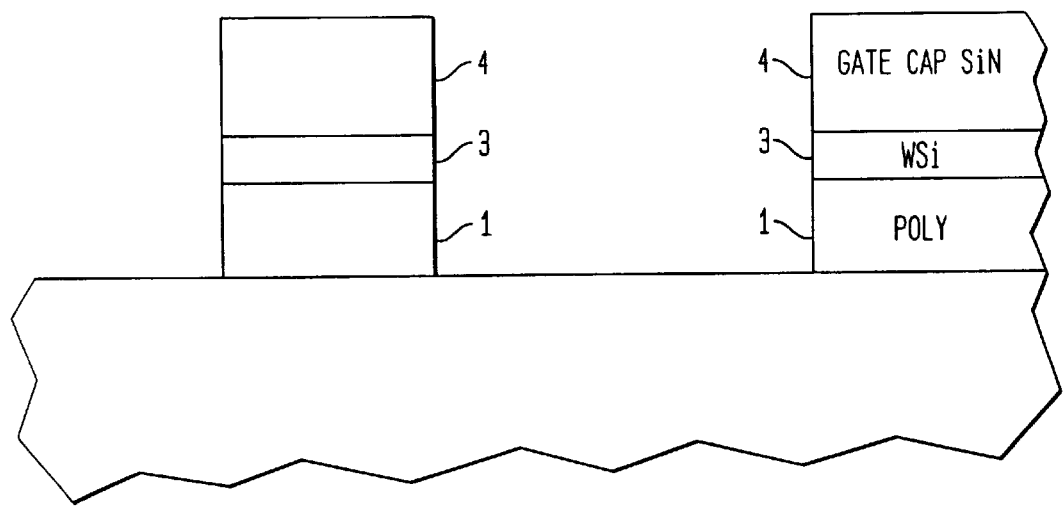
FIG. 1 is a cross sectional view of a portion of a chip during the first stage of forming a bit line contact.
Figure 2:
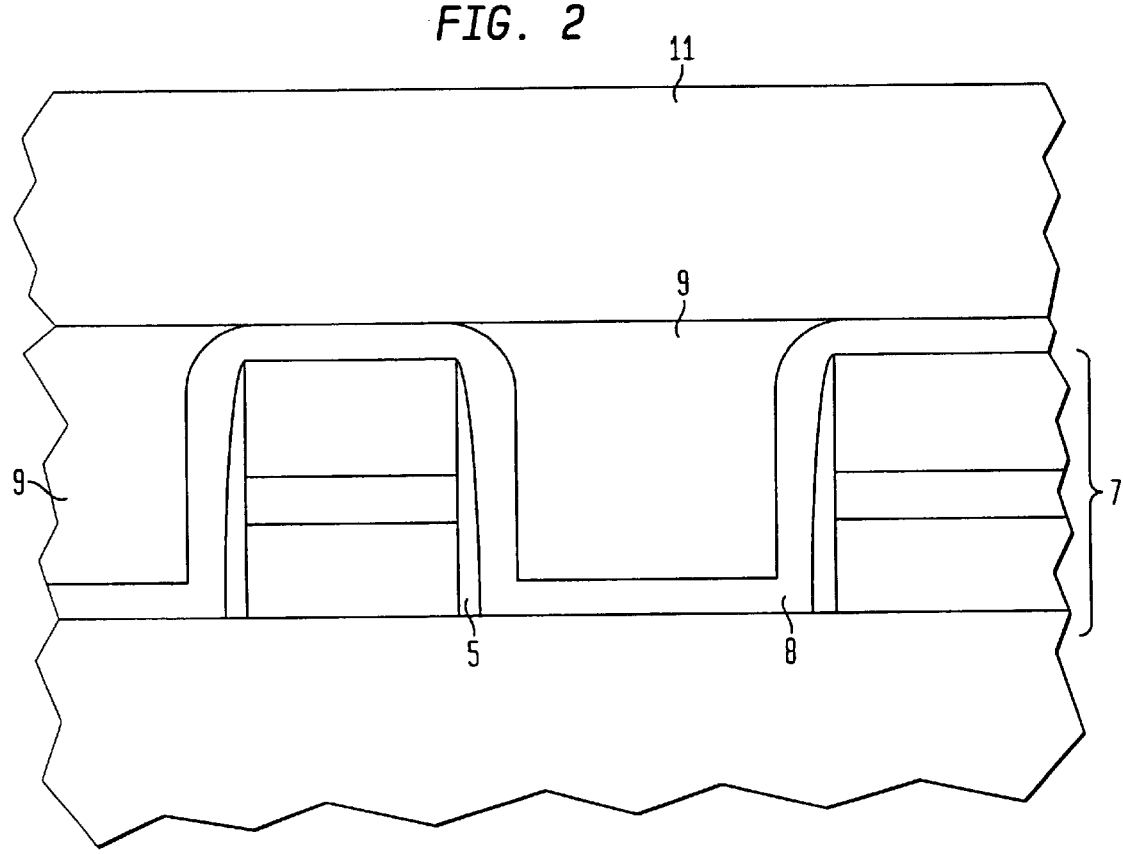
FIG. 2 is a cross sectional view of a portion of a chip during a second stage of forming a bit line contact.
Figure 3:
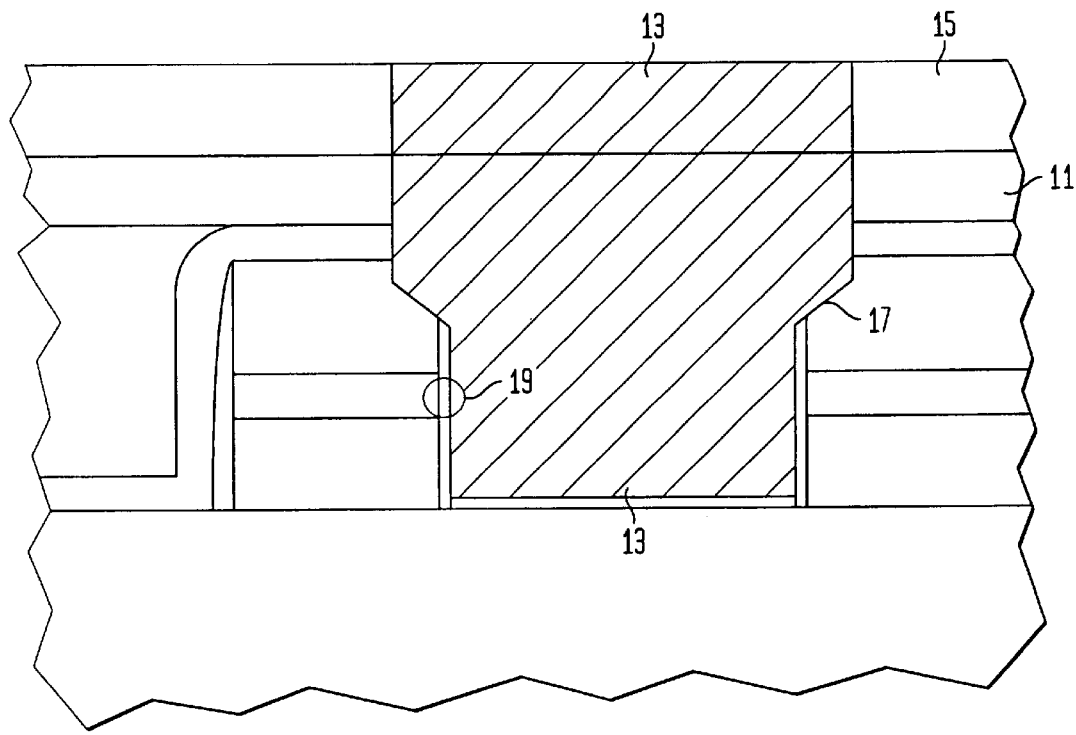
FIG. 3 is a cross sectional view of the completed formation of the bit line contact.

Referring now to the drawings, and more particularly to FIGS. 1–3, which illustrate three stages in the formation of a bit line contact. The first stage is shown in FIG. 1. As can be seen, gate stack deposition comprised of polysilicon layer 1, a tungsten suicide layer 3, and a gate cap silicon nitride 4 is deposited on a portion of a chip. The gate stack is etched to form gates.

FIG. 2 shows the cross section after deposition of spacer nitride, boro phospho silicate glass deposition, chemical mechanical polish, silicon dioxide deposition, and anneal. As can be seen, the spacer nitride 5 is deposited against each gate stack 7. A deposition of silicon oxy nitride 8 covers the exposed surface of the chip as well as the sides and top of the gate stack. Boro phospho silicate glass (BPSG) 9 fills in the depth between and over the gate stacks 7. A chemical mechanical polish smooths the surface of the BPSG 9, followed by a silicon dioxide 11 deposition and anneal.

Formation of carbon containing silicon oxy nitride 8 for deposition occurs at a relatively low temperature, between 500° and 700° C., preferably about 600° C., within a reaction chamber housing the semiconductor device being constructed. Carbon containing silicon oxy nitride is the result of the reaction of bis tertbutyl amino silane (BTBAS)

with an ammonia constituent (e.g. $NH_3$ or an ammonia containing precursor compound) and an oxidizer, such as $N_2O$, NO, and $CO_2$. Other oxidizers may be used as well. Other precursors such as ditertiary butylsilane or diethylsilane may also be used. This reaction provides for a high concentration of carbon throughout the film due to the BTBAS precursor. The concentration of carbon in the film will range between 1 and 10 atomic percent.

FIG. 3 shows the final stage for the invention. A mask is used with a self aligned contact (SAC) etch. Self aligned contact etch is done by reactive ion etching (RIE) process stopping on liner silicon oxy nitride 8. The resist is stripped, followed by a wet clean and liner etch stopping on underlying crystalline silicon substrate. The self aligned contact hole is next filled with polysilicon 13. Silicon dioxide layer is next deposited 11, and a trench is etched into this dielectric layer. This trench is subsequently filled with metal 15 and polished back to the silicon dioxide surface The metal filled trench is also called bit-line. A bit line contact to silicon substrate is hence formed. Slope 17 represents an area for potential shorts if selectivity to cap nitride is not enough during etch. This kind of undercut will generally always be present. Obviously, the deeper the undercut the greater potential for shorts. The silicon oxy nitride layer 8 with carbon throughout slows etch rates substantially in the nitride. Sidewall 19 has a potential for shorts or high leakage between the gates and bit line contact if the nitride liner becomes too thin or is etched out. We claim in this invention that if the conventional nitride liner is replaced by BTBAS based oxy-nitride liner or other carbon containing oxy-nitride liner, then the potential for shorts at the said location is greatly reduced thus giving an improvement in bit-line shorts yield. Our preliminary data suggests that the RIE selectivity of BTBAS based oxy-Nitride (shown in the following pages) is greater than that of conventional nitride liners. By improving the selectivity to Nitride liner the slope 17 is essentially prevented from propagating in a downward direction during the selective SAC etch. This is because the Nitride liner is eroded at a slower rate. Thus slope 17 does not progress downward towards the Tungsten silicide (WSi) gate as much as in the case of conventional liners. It should be noted that the closer this slope is to WSi, the greater the leakage current between the polysilicon (fill material of contact) and WSi gate. In other words shorts yield directly correlates with the proximity of this slope 17 to WSi gate stack, and in the event that this slope touches WSi, there is complete shorting of bit-line and gate line i.e. the device is dead. Therefore the RIE selectivity to Nitride liner is extremely critical.

Figure 4:
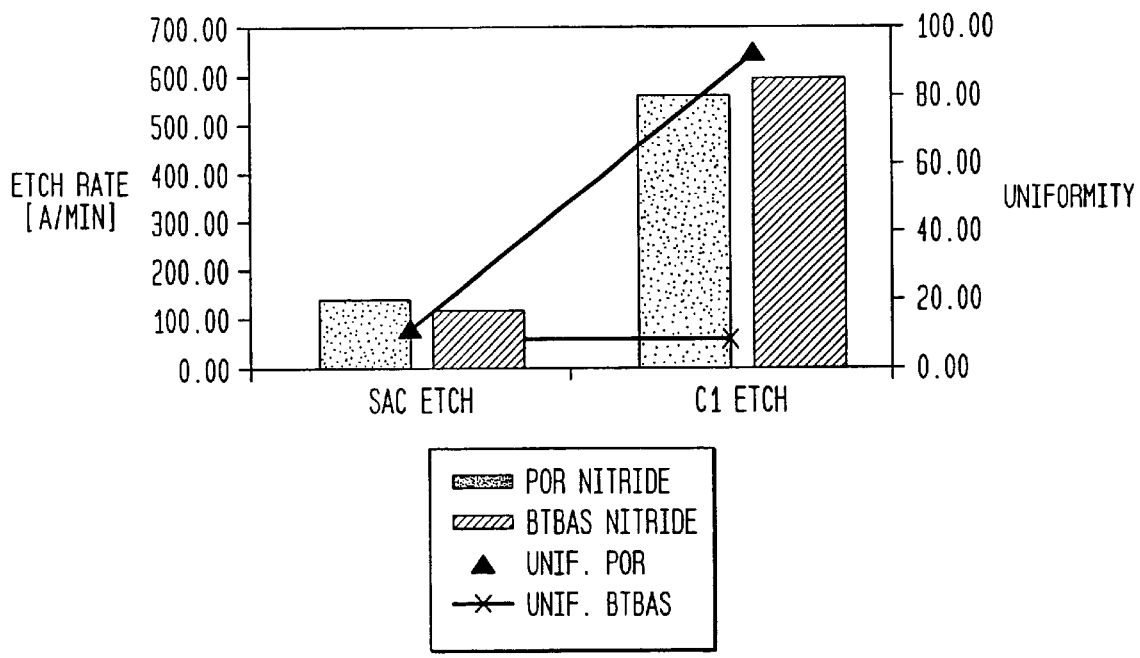
FIG. 4 is a bar graph comparing etch characteristics between bis-tertbutylaminosilane (BTBAS) and dichloro silane based nitride film.

FIG. 4 shows the etch characteristics of BTBAS based nitride film as well as the process of record DCS-based nitride. Two different etch processes were used, namely, a contact selective etch process using the traditional $C_4F_8$/CO chemistry, and the traditional etch (non-selective) chemistry using significantly lesser amounts of CO gas. The etch rates of BTBAS and DCS based nitride film is plotted in FIG. 4. It can be seen that for the selective etch process the blanket etch rate of BTBAS based nitride (120 A/min).is indeed lower than that of DCS based nitride (138 A/min). For the nonselective etch chemistry the etch rate for BTBAS is higher.

A 13% lower etch rate for BTBAS nitride liner is not only advantageous from selectivity point of view but also now one has the option of reducing the liner thickness for an improved BPSG gap fill. It was also found that the concentration of carbon in the BTBAS nitride was 4.5E21 atoms/cc. For comparison, the DCS nitride has carbon concentration of 1.9E18 atoms/cc. This data suggests an almost three orders of magnitude increase in the nitride film carbon content is needed for a 13% reduction in etch rate using selective contact chemistry.

BTBAS based nitride has higher hydrogen content compared to dichloro silane (DCS) or MS nitride (mono silane or $SiH_4$). Since hydrogen is a very good scavenger of fluorine (forms HF) therefore, it causes a decrease in fluorine concentration with corresponding drop in nitride etch rate. The hydrogen effect coupled with the carbon content in the film would combine to give increased selectivity to Nitride liner.

During liner etch, the gate cap nitride and corner nitride loss should be minimized. Therefore an oxy-nitride film is preferred over nitride because of ease of removal during liner etch. A carbon containing oxy-nitride film could now be used as opposed to nitride. With oxy-nitride it is possible to do contact etch without CO or $CO_2$ chemistry. Oxygen released from the liner film would help to remove polymer and etch BPSG. Oxygen would also help to increase fluorine concentration by scavenging carbon (forming CO or $CO_2$). If the carbon were not removed as CO or $CO_2$ then it would require the consumption of fluorine to form $C_2F_6$, which is volatile. At the same time the excess carbon in the liner film would improve selectivity.

In short, to increase the etch rate of BPSG without the need for CO or $CO_2$ type gas as part of etch chemistry, one would need carbon containing oxy-nitride film as opposed to nitride film. CO in general causes nickel (Ni) contamination in the chamber and is therefore not a preferred etch gas unless absolutely essential. Nickel contamination is one of the major concerns in a manufacturing environment and its avoidance would greatly bring down fixed manufacturing costs. It has been shown that BTBAS film has the potential for better selectivity to nitride as compared to DCS based films. In addition to the above described advantages, products employing silicon oxy nitride barrier, have better retention time anneal results as compared to products employing silicon nitride. Therefore, BTBAS based oxy-nitride is needed for improved contact process window and yeild.

Improvements in product can be seen at three points during the inventive process. During nonselective etch, the carbon-rich silicon oxy nitride layer provides a strong barrier. During selective etching, CO and $CO_2$ are no longer necessary, thus eliminating problems associated with nickel contamination. Finally, during liner removal silicon oxy nitride can be etched with higher selectivity to gate cap silicon nitride as compared to silicon nitride liner.

While the invention has been described in terms of its preferred embodiments, those skilled in the art will recognize that the invention can be practiced with modification within the spirit and scope of the appended claims.

We claim:

1. A method of forming a self-aligned feature comprising:

providing a multiplicity of gate stack depositions;

depositing a spacer nitride against a multiplicity of sides of each of said multiplicity of gate stacks;

depositing at a temperature between 500° C. and 700° C. a layer of silicon oxy nitride containing carbon over all exposed surfaces, wherein said carbon is evenly distributed throughout said silicon oxy nitride;

depositing boro phospho silicate glass (BPSG) filling a height above said gate-stack deposition;

chemical mechanical polishing said BPSG;

depositing oxide and annealing;

depositing a mask on said oxide;

etching a contact hole in said oxide through a portion of said gate stack to a first depth;

etching said contact hole further in said Silicon dioxide through a width of said nitride spacer to a second depth;

filling said contact hole with polysilicon;.

etching a bitline trench in said oxide; and filling said bitline trench with metal.

2. A method as in claim 1 wherein said temperature for depositing is between 600° C. and 650° C.

3. A method as in claim 1 wherein said oxide is deposited from silane or tetraethyl ortho silicate.

4. A method as in claim 1 wherein said step of depositing silicon oxy nitride comprises reacting bis(tertbutylamino) silane with ammonia and an oxidizer.

5. A method as in claim 4 wherein said oxidizer is selected from the group comprising $N_2O$, $O_2$, NO, and $CO_2$.

6. A method as in claim 1 wherein said carbon makes up between 1 and 10 atomic percent of said silicon oxy nitride layer.

* * * * *